US012782459B2

(12) United States Patent
Li et al.

(10) Patent No.: US 12,782,459 B2
(45) Date of Patent: Nov. 3, 2026

(54) METHOD AND DEVICE FOR BATTERY CAPACITY DETERMINATION, AND STORAGE MEDIUM

(71) Applicant: BYD COMPANY LIMITED, Shenzhen (CN)

(72) Inventors: Xiaoqian Li, Shenzhen (CN); Tianyu Feng, Shenzhen (CN); Linwang Deng, Shenzhen (CN); Jingjing Hong, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 197 days.

(21) Appl. No.: 18/758,033

(22) Filed: Jun. 28, 2024

(65) Prior Publication Data

US 2024/0353499 A1 Oct. 24, 2024

Related U.S. Application Data

(63) Continuation of application No. PCT/CN2022/118757, filed on Sep. 14, 2022.

(30) Foreign Application Priority Data

Mar. 29, 2022 (CN) ......................... 202210318139.5

(51) Int. Cl.
*G01R 31/392* (2019.01)
*G01R 31/3835* (2019.01)
*H02J 7/80* (2026.01)

(52) U.S. Cl.
CPC ....... *G01R 31/392* (2019.01); *G01R 31/3835* (2019.01); *H02J 7/80* (2026.01)

(58) Field of Classification Search
CPC ................ G01R 31/392; G01R 31/367; G01R 31/3835; G01R 31/387; H02J 7/80; H02J 7/84; Y02E 60/10
See application file for complete search history.

(56) References Cited

U.S. PATENT DOCUMENTS

| | | | | |
|---|---|---|---|---|
| 2012/0176092 A1 | 7/2012 | Fujii et al. | | |
| 2015/0285866 A1* | 10/2015 | Frost | G01R 31/3835 324/427 | |
| 2016/0356855 A1* | 12/2016 | Tamegai | H01M 10/44 | |

FOREIGN PATENT DOCUMENTS

| | | | |
|---|---|---|---|
| CN | 102074757 | A | 5/2011 |
| CN | 110549900 | A | 12/2019 |

(Continued)

OTHER PUBLICATIONS

Extended European Search Report dated May 8, 2025, issued in related European Patent Application No. 22934699.4 (7 pages).

(Continued)

*Primary Examiner* — Tung X Nguyen
(74) *Attorney, Agent, or Firm* — Sheppard Mullin Richter & Hampton LLP

(57) ABSTRACT

A method for determining a battery capacity, includes: acquiring a first inflection voltage, a first inflection electric power, a second inflection voltage, and a second inflection electric power of the battery, charging the battery and recording a first charging profile of the battery; determining a target inflection point of the battery according to the first charging profile; detecting the electric power until the charging is completed, acquiring a first charged electric power of the battery when the battery is charged to a first inflection point, and acquiring a second charged electric power of the battery when the charging is completed; and when the target inflection point includes the first inflection point, calculating a current capacity of the battery according to the first inflection electric power, the first charged electric power, and the second charged electric power. The first inflection voltage is greater than the second inflection voltage.

19 Claims, 3 Drawing Sheets

(56) References Cited

FOREIGN PATENT DOCUMENTS

| | | | |
|---|---|---|---|
| CN | 110549909 | A | 12/2019 |
| CN | 112578296 | A | 3/2021 |
| CN | 113866649 | A | 12/2021 |
| KR | 10-2007-0060867 | A | 6/2007 |
| KR | 10-0836391 | B1 | 6/2008 |
| KR | 10-2013-0128511 | A | 11/2013 |
| KR | 10-2015-0048439 | A | 5/2015 |
| WO | 2021/214875 | A1 | 10/2021 |

OTHER PUBLICATIONS

Wang, Limei et al., "On-board state of health estimation of LifePO4battery pack through differential voltage analysis", Applied Energy, Elsevier Science Publishers, GB, vol. 168, Feb. 12, 2016, pp. 465-472.
First Office Action dated Apr. 7, 2024, issued in related Chinese Patent Application No. 202210318139.5, with English machine translation (12 pages).
Second Office Action and Supplementary Search dated Sep. 18, 2024, issued in related Chinese Patent Application No. 202210318139.5, with English machine translation (10 pages).
Third Office Action and Supplementary Search dated Nov. 6, 2024, issued in related Chinese Patent Application No. 202210318139.5, with English machine translation (9 pages).
Request for the Submission of an Opinion dated May 15, 2025, issued in related Korean Patent Application No. 10-2024-7021718, with English machine translation (19 pages).
International Search Report and Written Opinion for Application No. PCT/CN2022/118757, mailed on Dec. 29, 2022, 11 pages.

* cited by examiner

METHOD AND DEVICE FOR BATTERY CAPACITY DETERMINATION, AND STORAGE MEDIUM

CROSS-REFERENCE TO RELATED APPLICATIONS

This application is a continuation application of International Patent Application No. PCT/CN2022/118757, filed on Sep. 14, 2022, which is based on and claims priority to and benefits of Chinese Patent Application No. 202210318139.5 filed on Mar. 29, 2022. The entire content of all of the above-referenced applications is incorporated herein by reference.

FIELD

The present disclosure relates to the field of battery technology, and in particular to a method and device for battery capacity determination, and a non-transitory computer-readable storage medium.

BACKGROUND

With the rapid development of battery technology, lithium-ion batteries have broad applications in electric vehicles, energy storage power plants, etc. The lithium-ion batteries gradually age during constant charge-discharge cycles, and performance degrades gradually, such as a decrease in capacity, an increase in internal resistance, and a decrease in power, etc. The degree of ageing of a battery is expressed as SOH (State of Health). The SOH can be defined in a number of ways, such as a residual capacity, an internal resistance, number of cycles, and the like. Among them, the most commonly used and intuitive way is to define by the battery residual capacity, i.e., the percentage of the capacity of the battery after aging to the initial capacity of the battery, also known as SOHC (State of Health Capacity).

Currently, the battery residual capacity is mainly calculated by charging and discharging the battery to calculate the total electric power during the charging or discharging phase, or by charging and discharging in certain SOC (State of Charge) interval to calculate the total battery capacity according to the electric power charged or discharged and the corresponding SOC interval.

However, the above methods for calculating the residual capacity of a battery have drawbacks. In particular, batteries fully charged and fully discharged not only take more time and device resources, a range of safety related issues such as overcharge fire and even explosion can also be triggered. Furthermore, calculating the battery residual capacity by a battery fully charged and fully discharged is not realistic in applications, because a user may typically charge the battery before the battery is fully discharged, making the battery full discharge conditions difficult to be triggered, and once triggered, and affecting the battery life. While charging or discharging at a certain SOC interval to obtain battery residual capacity, the SOC interval needs to be long enough, and there is also a problem of difficulty in triggering it, the accuracy of the SOC estimation is required to be high, and inaccurate SOC estimation can easily cause significant errors in the results.

SUMMARY

In order to solve the above technical problem, the present disclosure provides a method for battery capacity determination which can quickly calculate the battery capacity and improve the accuracy of the battery capacity calculation.

The present disclosure also provides a non-transitory computer-readable storage medium.

The present disclosure also provides a device for battery capacity determination.

In a first aspect, the present disclosure provides a method for determining a capacity of a battery, includes: acquiring a first inflection voltage, a first inflection electric power, a second inflection voltage, and a second inflection electric power of the battery, charging the battery and recording a first charging profile of the battery; determining a target inflection point of the battery according to the first charging profile; detecting the electric power until the charging is completed, acquiring a first charged electric power of the battery when the battery is charged to a first inflection point, and acquiring a second charged electric power of the battery when the charging is completed; and when the target inflection point includes the first inflection point, calculating a current capacity Qnow of the battery according to the first inflection electric power Q_HVTP, the first charged electric power Qch_HVTP, and the second charged electric power Qch_End. The first inflection voltage is greater than the second inflection voltage, and Qnow=Q_HVTP+Qch_End−Qch_HVTP.

In an embodiment, when the at least one target inflection point further comprises a second inflection point, acquiring a third charged electric power when the battery is charged to the second inflection point, and correcting the first inflection electric power according to the second inflection electric power Q_LVTP, the first charged electric power Q_HVTP, and the third charged electric power Qch_LVTP; where Q_HVTP=Q_LVTP+Qch_HVTP−Qch_LVTP.

According to the method for battery capacity determination in the embodiments of the present disclosure, the at least one target inflection point is determined by analyzing the first charging profile, and when the charging of the battery is detected i.e., the charging is completed, the first charged electric power is acquired when the battery is charged to the first inflection point, and the second charged electric power is acquired when the charging of the battery is completed; when the at least one target inflection point determined includes the first inflection point, the current capacity of the battery is calculated according to the first inflection electric power, the first charged electric power, and the second charged electric power. The calculation method of the embodiments of the present disclosure can be accurately calculated at any starting state prior to the target inflection point, without the need for deep discharge of the battery prior to charging, the loss of the battery itself from being fully charged or fully discharged is avoided, and the battery life and the charge safety are increased. Furthermore, when calculating the current capacity of the battery, it is only necessary to detect the first charged electric power when the battery is charged to the first inflection point and the second charged electric power when the charging of the battery is completed, which is beneficial for quickly calculating the battery capacity and does not require the selection of SOC intervals. Compared to calculating the battery capacity by selecting a SOC interval for charging or discharging, the errors caused by inaccurate SOC estimation on the battery state calculation can be avoided, and the accuracy of the battery capacity calculation is improved. Furthermore, in calculating the current capacity of the battery, the first inflection electric power of the aged battery may also be corrected according to the second inflection electric power, the first charged electric power and the third charged electric power when the battery is charged to the second inflection point, the accurate value of the first inflection electric power of the battery in the current state of aging may be obtained. As a result, inaccuracy of the current capacity calculation of the battery due to variation of the first inflection electric power due to battery aging can be avoided, which is advantageous for improving the accuracy of the battery capacity calculation. In summary, the method for battery capacity determination according to the present disclosure can greatly improve the speed and accuracy of the battery capacity calculation.

In an embodiment, the battery capacity determination method further includes: when the determined target inflection point includes only the first inflection point, and a difference between a current time and a time of last correction of the first inflection electric power is greater than a preset time, correcting the first inflection electric power according to a formula of the first inflection electric power as a function of time.

In an embodiment, the determining at least one target inflection point according to the first charging profile includes: acquiring a voltage differential profile of the first charging profile; acquiring a peak voltage corresponding to the maximum point of the voltage differential profile; and determining the at least one target inflection point by comparing the peak voltage to the first inflection voltage and the second inflection voltage.

In an embodiment, the determining the at least one target inflection point by comparing the peak voltage to the first inflection voltage and the second inflection voltage includes: If the peak voltage is greater than the first inflection voltage, the maximum point is the target inflection point, and the target inflection point is the first inflection point; or, if the peak voltage is less than the second inflection voltage, the maximum point is the target inflection point, and the target inflection point is the second inflection point.

In an embodiment, the determining the at least one target inflection point by comparing the peak voltage to the first inflection voltage and the second inflection voltage further includes: If the peak voltage is neither greater than the first inflection voltage nor less than the second inflection voltage, continuing to charge the battery and searching for the target inflection point.

In an embodiment, the first charging profile is a voltage-capacity characteristic profile established according to first voltage data and corresponding first capacity data of the battery during charging, the acquiring a voltage differential profile of the first charging profile includes: performing smoothing filtering on the first charging profile, and first order derivation on the first voltage data with respect to the first capacity data, acquiring a rate of change of the first voltage data with respect to the first capacity data, establishing the voltage differential profile of the first charging profile according to the rate of change and the first capacity data.

In an embodiment, the acquiring a first inflection voltage, a corresponding first inflection electric power, a second inflection voltage and a corresponding second inflection electric power of a battery includes: acquiring a second charging profile of the battery; determining the first inflection point and the second inflection point according to the second charging profile; and acquiring the first inflection voltage and the first inflection electric power corresponding to the first inflection point, and the second inflection voltage and second inflection electric power corresponding to the second inflection point.

In an embodiment, the acquiring a second charging profile of the battery includes: determining one or more reference batteries; discharging the reference batteries and performing constant current charging; recording second capacity data and corresponding second voltage data during the constant current charging of the one or more reference batteries; and establishing a voltage-capacity characteristic profile according to the second capacity data and the corresponding second voltage data, to acquire the second charging profile.

In an embodiment, the method for battery capacity determination further includes: acquiring an initial capacity of the battery; and calculating State of Health Capacity (SOHC) of the battery according to the current capacity of the battery and the initial capacity of the battery.

In an embodiment, the recording a first charging profile of the battery in real time includes: collecting and recording, by a Battery Management System (BMS), at least one parameter of the battery: voltage, current, temperature, time of current charge, and charged electric power; and acquiring the first charging profile according to the at least one parameter by using a BMS charging algorithm.

In an embodiment, the first electric power is less than the second electric power.

In an embodiment, the first inflection voltage is a corresponding voltage of a high voltage plateau inflection point in a second charging profile, and the first inflection electric power is a corresponding inflection electric power of a high voltage plateau inflection point in the second charging profile.

In an embodiment, the second inflection voltage is a corresponding voltage of a low voltage plateau inflection point in the second charging profile, and the second inflection electric power is a corresponding inflection electric power of a low voltage plateau inflection point in the second charging profile.

In an embodiment, the method for battery capacity determination further includes: acquiring capacities of the battery calculated in previous n times and calculating weighted capacity of the battery according to the current capacities of the battery calculated in previous n times.

In an embodiment, the State of Health Capacity (SOHC) of the battery is calculated according to the weighted current capacity of the battery and the initial capacity of the battery.

In an embodiment, the acquiring a third charged electric power when the battery is charged to the second inflection point includes: acquiring, by the Battery Management System (BMS), a third charged electric power when the battery is charged to the second inflection point.

In an embodiment, the method for battery capacity determination is performed by a computer program stored on non-transitory computer-readable storage medium.

In a second aspect, the present disclosure provides a non-transitory computer-readable storage medium, storing a computer program which, when executed by a processor, causes the processor to perform operations as described above.

The non-transitory computer-readable storage medium according to the embodiments of the present disclosure can greatly improve the speed and accuracy of battery capacity calculation by executing a computer program stored thereon.

A third aspect, the present disclosure provides a device for battery capacity determination, the device for battery capacity determination includes at least one processor, and a memory connected with the at least one processor, the memory stores instructions which executed by the at least one processor, the at least one processor is configured to perform operations as described above.

The device for battery capacity determination according to the embodiments of the present disclosure can greatly improve the speed and accuracy of the battery capacity calculation by the processor executing the above-described method for battery capacity determination.

A battery whose capacity is calculated using method for battery capacity determination as described above.

The battery according to the embodiments of the present disclosure, the capacity of which is calculated using the above-described method for battery capacity determination, can greatly improve the speed and accuracy of the battery capacity calculation.

Additional aspects and advantages of the present disclosure will be set forth in part in the description which follows, and in part will be obvious from the description, or may be learned by practice of the present disclosure.

BRIEF DESCRIPTION OF THE DRAWINGS

In order to more clearly illustrate the technical solutions of the embodiments of the present disclosure, the drawings required for use in the embodiments will now be briefly described, and it will be apparent that the drawings in the following description are some embodiments of the present disclosure, from which further drawings can be derived for a person skilled in the art.

DETAILED DESCRIPTION

In order to make the objects, technical solutions and advantages of the present disclosure more apparent, examples of the embodiments according to the present disclosure will be described in detail below with reference to the accompanying drawings. The described embodiments are only part of the embodiments of the present disclosure, and not all embodiments of the present disclosure, it should be understood that the present disclosure is not limited by the example embodiments described herein. All other embodiments obtained by a person skilled in the art, based on the embodiments of the present disclosure described in the present disclosure, shall fall within the scope of the present disclosure.

The embodiments of the present disclosure are described below in detail. Examples of the embodiments are shown in the accompanying drawings, and the same or similar reference signs in all the accompanying drawings indicate same or similar components or components having same or similar functions throughout. The embodiments described below with reference to the accompanying drawings are examples, are to explain the present disclosure and cannot be construed as a limitation on the present disclosure.

For solving the problems existing in the prior art, a method for battery capacity determination provided by the embodiments of the present disclosure can greatly improve the speed and accuracy of battery capacity calculation. A single general concept of the calculation method according to the embodiments of the present disclosure is to accurately calculate the battery capacity by detecting the voltage-capacity profile during the charging process of the tested battery in real time, analyzing the characteristics of the profile, and searching for characteristic points of the profile, so that there is no need to deeply discharge the battery prior to charging and the initial SOC state of the battery could be unknown.

First, the characteristic points of the profiles used in the embodiments of the present disclosure are explained and illustrated.

Figure 1:
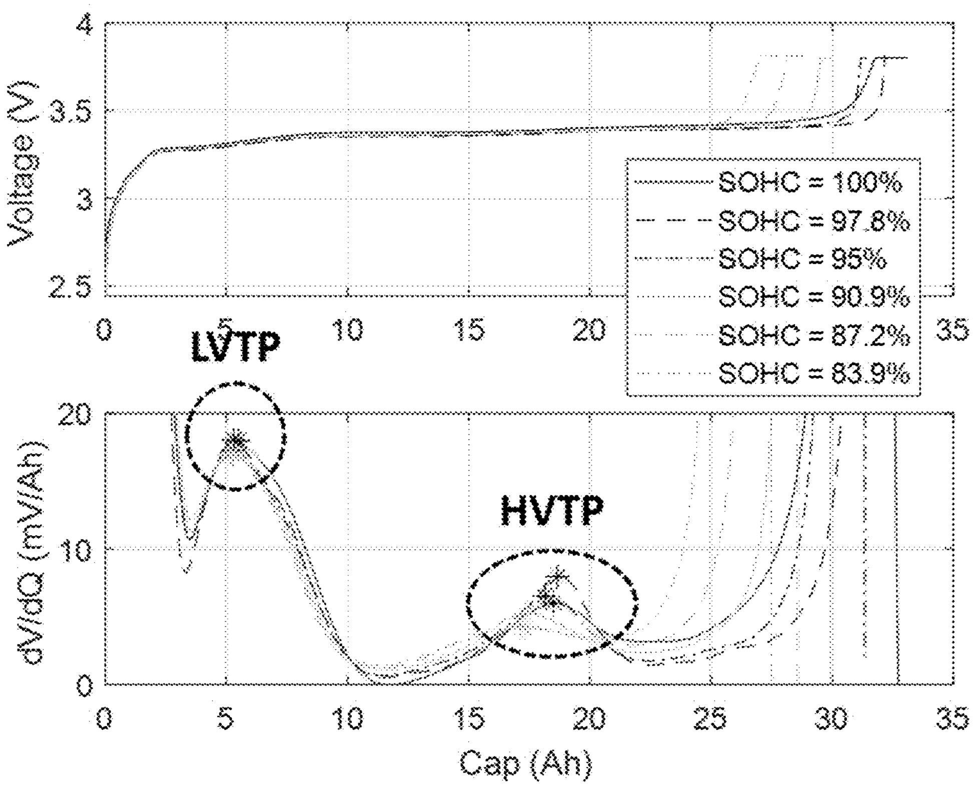
FIG. 1 is a comparative schematic diagram of the first charging profile and charging voltage differential profile of batteries with different degrees of aging according to an embodiment of the present disclosure.

Please refer to FIG. 1, in general, the voltage-capacity characteristic profile (i.e., charging profile) of a battery (such as, but not limited to, a lithium-ion battery) presents three intervals of slower voltage variation, called voltage plateau region. There is a region where the voltage changes more rapidly between the two voltage plateau regions, the point with the fastest voltage change in this region is referred to as the voltage plateau inflection point, which is distinguished by the high and low voltage. The point with the higher voltage is called the high voltage plateau inflection point (noted HVTP), and the point with the lower voltage is called the low voltage plateau inflection point (noted LVTP). The voltage plateau inflection point appears on the voltage differential profile as a maximum point of the profile, in practical applications, the high voltage plateau inflection point can be distinguished from the low voltage plateau inflection point according to the high and low voltage values. Taking the power lithium-ion battery of an electric vehicle as an example, the SOC state at which charging begins is uncertain, if charging begins at a lower SOC segment (e.g. 5%), two plateau inflection points, HVTP, LVTP, can be detected during charging; if charging begins in the intermediate SOC segment (i.e. The area between HVTP and LVTP), only one plateau inflection point HVTP can be detected during charging. FIG. 1 shows charging profiles and voltage differential profiles for various batteries, with different profiles representing batteries with different aging levels, and it is not difficult to see that the profile for a less aged battery will have two high and low voltage plateau inflection points.

It is known to a person skilled in the art that, as shown in FIG. 1, as the battery ages, the voltage-capacity characteristic profile of the battery may shift towards the low capacity direction, the inflection electric power Q_LVTP (or referred to as low voltage plateau inflection characteristic capacity) corresponding to LVTP remains substantially unchanged during movement, that is, the inflection electric power Q_LVTP is a fixed value, the inflection electric power Q_HVTP corresponding to HVTP (or referred to as high voltage plateau inflection characteristic capacity) varies less over a range of aging, but the voltage corresponding to each of HVTP and LVTP does not change as the characteristic profile shifts, so that the detected plateau inflection points can be distinguished by voltage.

Based on the above explanations, a method for battery capacity determination according to the embodiments of the present disclosure is described below with reference to the accompanying drawings.

Figure 2:
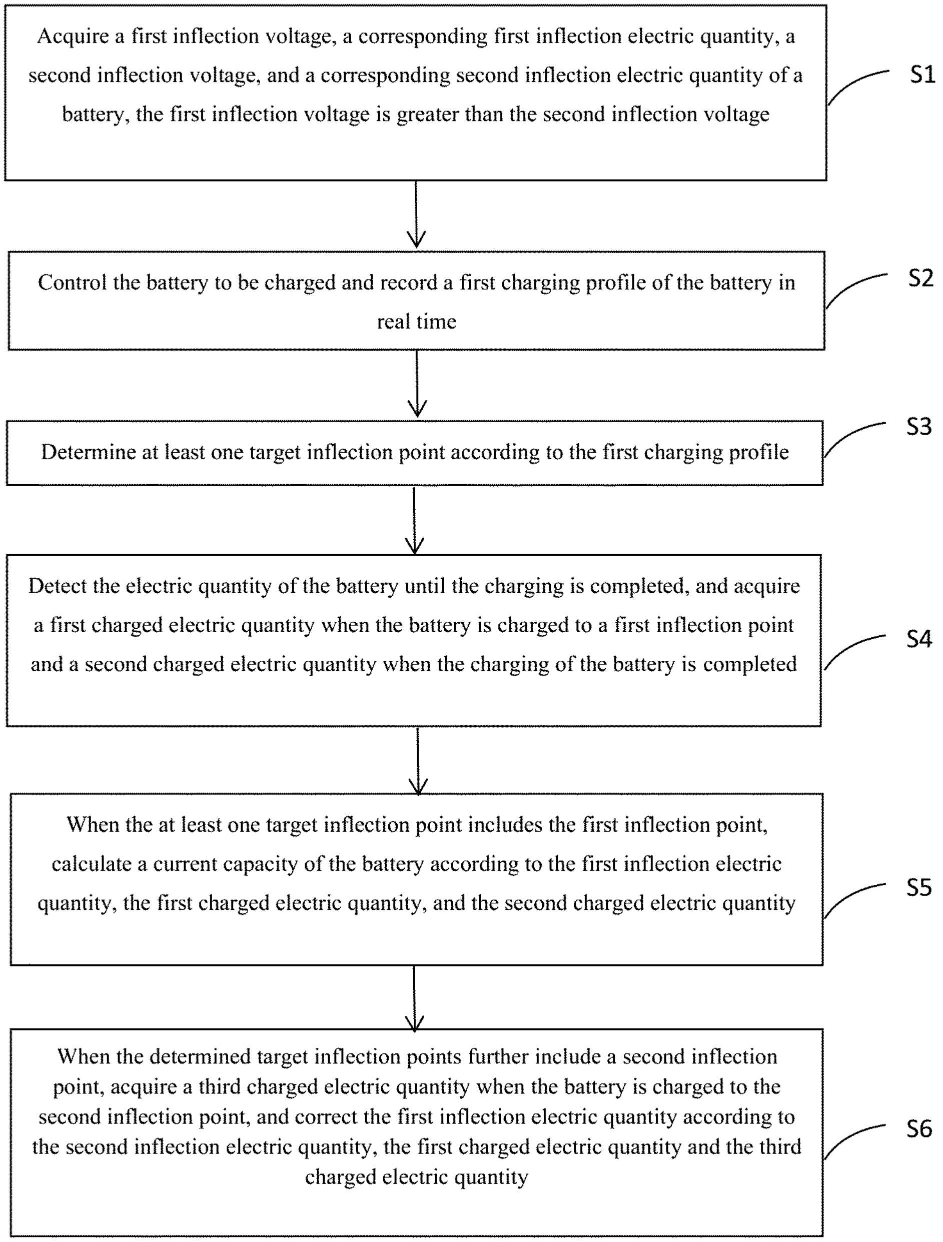
FIG. 2 is a flow diagram of a method for battery capacity determination according to an embodiment of the present disclosure.

FIG. 2 is a flow chart of a method for battery capacity determination according to one of the embodiments of the present disclosure, as shown in FIG. 2, the method for battery capacity determination of the embodiments of the present disclosure including at least steps S1-S5. The process of each step is as follows.

Step S1: A first inflection voltage, a corresponding first inflection electric power, a second inflection voltage and a corresponding second inflection electric power of a battery are acquired, and the first inflection voltage is greater than the second inflection voltage. The first inflection voltage and the first inflection electric power are the corresponding voltage and inflection electric power of the high voltage plateau inflection point, and the second inflection voltage and the second inflection electric power are the corresponding voltage and inflection electric power of the low voltage plateau inflection point. The first inflection voltage and the first inflection electric power are both characteristic parameters of the battery as it comes out of the factory, and both correspond to the first inflection point of the battery as it comes out of the factory. Similarly, the second inflection voltage and the second inflection electric power are both characteristic parameters of the battery as it comes out of the factory, and both correspond to the second inflection point of the battery as it comes out of the factory. The first inflection point and the second inflection point are characteristic points of the battery, change with battery aging. At the factory, the first and second inflections respectively correspond to the first and second inflection voltages, or the first and second inflections correspond to the first and second inflection electric quantities, respectively. As the battery is used, however, the battery capacity decreases and the voltage values corresponding to the first inflection point and the second inflection point may change. In some cases, the voltage corresponding to the second inflection point may be less than the second inflection voltage, and the voltage corresponding to the first inflection point is generally not much different from the first inflection voltage.

In an embodiment of the present disclosure, for batteries with determined batches and specifications, the voltage and the inflection electric power corresponding to a high-voltage plateau inflection point or a low-voltage plateau inflection point in the voltage-capacity profile can be determined, and the values of these characteristic quantities can be obtained by voltage-capacity profiles of a small number of batteries, as will be described in more detail below.

Step S2: The battery is controlled to be charged (e.g., by a charger) and a first charging profile of the battery is recorded in real time.

In an embodiment of the present disclosure, when a battery of unknown SOC state is charged, first capacity data and corresponding first voltage data of the battery during charging are recorded in real time, a voltage-capacity characteristic profile, i.e., the first charging profile, is established according to the first capacity data and the first voltage data. Taking a lithium ion power battery as an example, in the prior art, when the Li-ion power battery is charged, the Battery Management System (BMS) can be used to collect and record the voltage, current, temperature, current charging time, charged electric power, and other parameters of the lithium-ion power battery. The charging profile of the lithium-ion power battery can be obtained according to the BMS charging algorithm, which will not be elaborated on.

Step S3: At least one target inflection point is determined (e.g., by a processor) according to the first charging profile.

In an embodiment of the present disclosure, analyze the first charging profile for an inflection point thereof, and determine, according to the first inflection voltage and the second inflection voltage, whether an inflection point of the first charging profile is a target inflection point. As previously mentioned, for a battery of unknown SOC state, at least a high voltage plateau inflection point may be detected during its charging, i.e., meaning that the target inflection point includes at least a high voltage plateau inflection point (defined as the first inflection point), and the determination method of the target inflection point will be described in more detail later.

Step S4: The electric power is detected (e.g., by a processor) until the charging is completed, a first charged electric power is acquired when the battery is charged to a first inflection point and a second charged electric power is acquired when the charging of the battery is completed. Note that completion of charge means that battery reaches full charge state.

In an embodiment of the present disclosure, upon detecting that the electric power of the battery reaches a full charge electric power, a charged electric power from a start of charging of the battery to a time when the battery is charged to the first inflection point is used as the first charged electric power, a charged electric power from a start of charging of the battery to a completion of charging of the battery is used as the second charged electric power, the first charged electric power is less than the second charged electric power. The charged electric power of the battery during charging can be acquired by the aforementioned BMS, which will not be elaborated on. For example, the electric power at the start of charging is 10% of the battery capacity, after a certain time of charging, the battery is charged to a first inflection point, at this time, the electric power of the battery reaches 60% of the battery capacity, in this case, the first charged electric power is 60% at the time of charging to the first inflection minus 10% at the start of charging, i.e., the first charged electric power is 50% of the battery capacity. Similarly, continuing to charge the battery, 100% of the battery capacity is reached at the completion of charging of the battery. Since the second charged electric power is the charged electric power at the completion of charging of the battery, thus, in this case, the second charged electric power is 100% minus 10% at the start of charging, i.e., the second charged electric power is 90% of the battery capacity. But it is worth noting that the battery capacity decays as the battery is used over time due to factors such as battery aging. That is, the first charged electric power and the second charged electric power gradually decrease as the battery ages.

Step S5: When the at least one target inflection point determined includes the first inflection point, a current capacity of the battery is calculated according to the first inflection electric power, the first charged electric power, and the second charged electric power. The current capacity of the battery also is known as the total electric power of the battery in its current state.

It will be appreciated that for batteries of unknown SOC state, at least a high voltage plateau inflection point (i.e., the first inflection point) can be detected during its charging, and that means that the first inflection point is relatively easy to be triggered. In an embodiment of the present disclosure, when the at least one target inflection point determined includes the first inflection point (i.e., a high voltage plateau inflection point), a current capacity of the battery is calculated according to the first inflection electric power, the first charged electric power, and the second charged electric power, and the state of the battery is determined by the current capacity of the battery in favor of timely updating of the battery state.

In an embodiment of the present disclosure, the first inflection electric power, the first charged electric power, the second charged electric power, and the current capacity of the battery are defined as Q_HVTP, Qch_HVTP, Qch_End, and Qnow, respectively, the first inflection electric power Q_HVTP, the first charged electric power Qch_HVTP, the second charged electric power Qch_End, and the current capacity of the battery Qnow satisfy the relationship: Qnow=Q_HVTP+Qch_End−Qch_HVTP. In other words, as long as the first inflection electric power Q_HVTP, the first charged electric power Qch_HVTP, and the second charged electric power Qch_End are determined in the method for battery capacity determination according to the present embodiment, the current capacity Qnow of the battery can be quickly calculated according to the aforementioned relationship.

In summary, the method for battery capacity determination according to the embodiments of the present disclosure, when a battery of unknown SOC state is charged, the at least one target inflection point is determined by analyzing the first charging profile of the battery, and when the charging of the battery is detected i.e., the charging is completed, the first charged electric power when the battery is charged to the first inflection point (i.e., the high voltage plateau inflection point) and the second charged electric power when the charging of the battery is completed are acquired. When the at least one target inflection point determined includes the first inflection point, the current capacity of the battery can be calculated according to the first inflection electric power, the first charged electric power, and the second charged electric power that have been acquired. That is, The calculation method of the embodiments of the present disclosure can be accurately calculated at any starting state prior to the target inflection point, without the need for deep discharge of the battery prior to charging, the loss of the battery itself from being fully charged (e.g., 100% charged of battery capacity) or fully discharged (e.g., 0% charged of battery capacity) is avoided, and the battery life and the charge safety are increased; furthermore, when calculating the current capacity of the battery, it is only necessary to detect the first charged electric power when the battery is charged to the first inflection point and the second charged electric power when the charging of the battery is completed, which is beneficial for quickly calculating the battery capacity and does not require the selection of SOC intervals, compared to calculating the battery capacity by selecting a SOC interval for charging or discharging, errors caused by inaccurate SOC estimation in the battery state calculation can be avoided, and the accuracy of the battery capacity calculation is improved. In summary, the method for battery capacity determination according to the present disclosure can greatly improve the speed and accuracy of the battery capacity calculation.

It will be appreciated that in the embodiments of the present disclosure, step S1 of the acquiring a first inflection voltage, a corresponding first inflection electric power, a second inflection voltage and a corresponding second inflection electric power of a battery includes: acquiring a second charging profile of the battery; determining the first inflection point and the second inflection point according to the second charging profile; and acquiring the first inflection voltage and the first inflection electric power corresponding to the first inflection point, and the second inflection voltage and second inflection electric power corresponding to the second inflection point.

In particular, in a testing phase of the battery, a portion of reference batteries can be selected from a number of the batteries of the same batch, of the same scale, and discharged, and constant current charging is performed. The second capacity data and corresponding second voltage data during charging of the reference battery are recorded, and a voltage-capacity characteristic profile is established according to the second capacity data and the second voltage data during charging of the reference battery, and the second charging profile is acquired. By analyzing a profile characteristic of the second charging profile, the first inflection voltage and the first inflection electric power corresponding to the first inflection point (i.e., a high voltage plateau inflection point), and the second inflection voltage and second inflection electric power corresponding to the second inflection point (i.e., a low voltage plateau inflection point) are determined. The analysis process is the same as the analysis of the charging profile of the battery in the testing stage in the prior art, and will not be elaborated on.

It will be appreciated that since for a determined batch of batteries, the inflection electric quantities Q_HVTP, Q_LVTP, and corresponding voltages corresponding to the high and low voltage plateau inflection points are determined, only a small number of battery profiles are required to determine the values of these characteristic quantities, therefore, the reference battery in the embodiments of the present disclosure may be the battery to be tested itself, or one or several batteries of the same batch as the battery to be tested may be selected. The second charging profile, the first inflection voltage and the corresponding first inflection electric power, and the second inflection voltage and the corresponding second inflection electric power may be pre-existing in a non-transitory computer-readable storage medium, such as NVM (non-volatile memory) or other software included in a BMS.

It is further noted that in an embodiment of the present disclosure, the step S3 of determining at least one target inflection point according to the first charging profile includes: acquiring a voltage differential profile of the first charging profile; acquiring a peak voltage corresponding to the maximum point of the voltage differential profile; and comparing the peak voltage to the first inflection voltage and the second inflection voltage to determine the target inflection point.

In some embodiments, the acquiring a voltage differential profile of the first charging profile includes: performing smoothing filtering on the first charging profile, and first order derivation on the first voltage data with respect to the first capacity data, acquiring a rate of change of the first voltage data with respect to the first capacity data, establishing the voltage differential profile of the first charging profile according to the rate of change and the first capacity data, see FIG. 1.

In some embodiments, the comparing the peak voltage to the first inflection voltage and the second inflection voltage to determine the target inflection point includes: if the peak voltage is greater than the first inflection voltage, the maximum point is the target inflection point, and the target inflection point is the first inflection point; or, if the peak voltage is less than the second inflection voltage, the maximum point is the target inflection point, and the target inflection point is the second inflection point. As will be appreciated by a person skilled in the art, in the embodiments of the present disclosure, if a peak voltage does not meet any of the above relationships with the first inflection voltage threshold or the second inflection voltage, continuing to search for a next peak voltage versus the first voltage or the second voltage.

In an embodiment, with reference to FIG. 1, for batteries of any aging degree, according to the corresponding voltage differential profile, and combining voltage value magnitudes of the first inflection voltage and the second inflection voltage, a first inflection point (HVTP) as well as a second inflection point (LVTP) may be determined. Further, select a maximum point within an interval of the voltage differential profile, determine whether the point is a maximum point of the voltage differential profile, and if not, continue to charge the battery, search for the maximum point of the profile by recording in real time first voltage data and first capacity data during charging; if the maximum point is determined, acquire a peak voltage corresponding to the maximum point of the voltage differential profile according to the maximum point, compare the peak voltage to the first inflection voltage in the second charging profile, if the peak voltage is greater than the first inflection voltage, indicate that the peak voltage is the target inflection point, and the target inflection electric power is the first inflection electric power; compare the peak voltage to a second inflection voltage in a second charging profile, if the peak voltage is less than the second inflection voltage, indicate that the peak voltage is the target inflection point, and the target inflection electric power is the second inflection electric power. If the peak voltage is neither greater than the first inflection voltage nor less than the second inflection threshold, continue to charge the battery and search for the target inflection point. Thus, in the embodiments of the present disclosure, by increasing the limiting condition of the voltage value, the detected target inflection point can be determined to be the first inflection point or the second inflection point, misjudgments caused by the abnormal inter-interval data of the special case can also be filtered, and the accuracy of the battery state calculation is improved.

As previously mentioned, as the battery ages, the voltage-capacity characteristic profile of the battery will shift overall towards the low capacity direction, a first inflection electric power Q_HVTP corresponding to a first inflection point (HVTP) during the movement varies within an aging range, while a second inflection electric power Q_LVTP corresponding to a second inflection point (LVTP) remains substantially unchanged. The first inflection electric power Q_HVTP changes due to battery aging, as such, the accuracy of the current capacity Qnow of the battery calculated according to the first inflection electric power Q_HVTP will be affected. In order to improve the accuracy of the battery capacity calculation, the method for battery capacity determination of the embodiments of the present disclosure further includes the step of correcting the first inflection electric power Q_HVTP.

In particular, as shown in FIG. 2, in some embodiments, the method for battery capacity determination further includes a step S6:

When determined target inflection points further include second inflection point, a third charged electric power is acquired when the battery is charged to the second inflection point, and the first inflection electric power is corrected according to the second inflection electric power, the first charged electric power and the third charged electric power.

The third charged electric power is smaller than first charged electric power, and the third charged electric power when battery is charged to second inflection point during charging can be obtained by aforementioned BMS, and will not be elaborated on here.

In an embodiment of the present disclosure, the third charged electric power is defined as Qch_LVTP, the first inflection electric power Q_HVTP, the second inflection electric power Q_LVTP, the first charged electric power Qch_HVTP, and the third charged electric power Qch_LVTP will satisfy the relationship: Q_HVTP=Q_LVTP+Qch_HVTP−Qch_LVTP. In other words, after determining the second inflection electric power Q_LVTP and obtaining the third charged electric power defined as Qch_LVTP and the first charged electric power Qch_HVTP, the first inflection electric power Q_HVTP may be corrected.

It will be appreciated that for batteries with determined batches and specifications, the second inflection point electric power Q_LVTP is a fixed value that does not change due to aging, and the third charged electric power Qch_LVTP and the first charged electric power Qch_HVTP of the battery in any one of the aging states are determined values acquired in real time during charging of the battery, a first inflection electric power Q_HVTP of the aged battery is corrected according to the second inflection electric power Q_LVTP, the first charged electric power Qch_HVTP and the third charged electric power Qch_LVTP, and an accurate value of the first inflection electric power Q_HVTP of the battery in the current state of aging may be obtained, thus, the inaccurate calculation of the current capacity Qnow of the battery due to changes in the first inflection electric power Q_HVTP caused by battery aging can be avoided, which is beneficial for improving the accuracy of the battery capacity calculation.

Furthermore, it will be appreciated that different users have different usage habits for charging and discharging batteries. Some users are used to charging batteries after they are discharged to a lower SOC segment or occasionally charging batteries after they are discharged to a lower SOC segment, as such, the second inflection point may be triggered frequently or occasionally during charging of the battery. According to the correction method of the first inflection electric power Q_HVTP in the above-described embodiment, the first inflection electric power Q_HVTP of the battery may be corrected in time according to the second inflection electric power Q_LVTP, the first charged electric power Qch_HVTP and the third charged electric power Qch_LVTP. Also some users are used to charging batteries before they are discharged to a lower SOC segment, such that the second inflection point may not be triggered for a long time during charging of the battery, such that the first inflection electric power Q_HVTP will not be corrected in time according to the second inflection electric power Q_LVTP, the first charged electric power Qch_HVTP, and the third charged electric power Qch_LVTP.

In order to meet the usage habits of different users for charging and discharging batteries, in some other embodiments, the method for battery capacity determination further includes: when the target inflection point includes only the first inflection point, and a difference between a current time and a time of last correction of the first inflection electric power is greater than a preset time, correcting the first inflection electric power a formula of the first inflection electric power as a function of time.

The preset time may be set according to an aging speed of the battery, for example, the preset time may be 8 months, 10 months, or 1 year for a battery having a slower aging rate, and may be 4 months, 5 months, or 6 months for a battery having a faster aging rate, and the preset time may be set according to the aging rate of the battery, without limitation.

In an embodiment of the present disclosure, defining the current time from the time of last correction of the first inflection electric power Q_HVTP as ΔT, an empirical formula of the first inflection electric power Q_HVTP as a function of time as f(ΔT), and the corrected first inflection electric power as Q_HVTP_ΔT, the first inflection electric power Q_HVTP, the empirical formula f(ΔT) and the corrected first inflection electric power Q_HVTP_ΔT satisfy the relationship:

$$Q\_HVTP\_\Delta T = Q\_HVTP - f(\Delta T).$$

As is known to a person skilled in the art, the empirical formula of the first inflection electric power Q_HVTP as a function of time is different for the batteries of different batches and different specifications, and the empirical formula of the first inflection electric power Q_HVTP as a function of time f(ΔT) for the batteries of determined batches and specifications can be obtained through a number of tests, which will not be elaborated on here.

As described above, for batteries in which the second inflection point is not triggered for a long time during charging, the first inflection electric power Q_HVTP may be corrected according to the last corrected first inflection electric power Q_HVTP and a test-obtained empirical formula of the first inflection electric power Q_HVTP as a function of time defined as f(ΔT), as such, the inaccurate calculation of the current capacity Qnow of the battery due to changes in the first inflection electric power Q_HVTP caused by battery aging and the first inflection electric power Q_HVTP not being corrected in time according to the second inflection electric power Q_LVTP corresponding to the triggered second inflection point can be avoided, and the accuracy of the battery state calculation is improved.

According to the above two methods for correcting the first inflection electric power Q_HVTP, the method for battery capacity determination in the embodiments of the present disclosure can satisfy different usage habits for charging and discharging batteries by different users. It will be appreciated that regardless of the correction methods, the corrected first inflection electric power Q_HVTP and the correction time of the first inflection electric power Q_HVTP may be stored in a readable storage medium, such as the NVM or other software contained in the aforementioned BMS, to facilitate the next calculation of the state of the battery.

Further, in an embodiment of the present disclosure, the method for battery capacity determination further includes: acquiring an initial capacity of the battery; and calculating the SOHC of the battery according to the current capacity of the battery and the initial capacity of the battery. In particular, the initial capacity of the battery is defined as Qnew, the SOHC of the battery, the current capacity of the battery Qnow, and the initial capacity of the battery Qnew satisfy the relationship: SOHC-Qnow/Qnew*100%.

In an embodiment, to eliminate random errors, i.e. calculation error of the current capacity of the battery due to random causes such as temperature, current or system algorithm error, etc., the current capacities of the battery calculated in previous n times can be acquired, and the weighted current capacity Qnow of the battery can be calculated according to the current capacities of the battery calculated in previous n times, and the SOHC of the battery can be calculated according to the weighted current capacity Qnow of the battery. In an embodiment, the weighted current capacity Qnow of the battery may be calculated according to the following formula:

$$Qnow = n_1 Qnow_1 + n_2 Qnow_2 + \ldots + n_n Qnow_n$$

Qnow is weighted current capacity of battery, Qnow1 to Qnown are current capacities of the battery calculated in previous n times, n1-nn are weight parameters corresponding to current capacities of battery n times, $n_1+n_2+\ldots n_n=1$, and the value of n1-nn may be set in conjunction with historical data and current operating conditions of battery, without limitation.

After calculating weighted current capacity Qnow of battery, SOHC of battery is calculated according to above SOHC calculation formula, and the calculation results are more accurate.

The method for battery capacity determination in an embodiment of the present disclosure is described below, taking the power battery of an electric vehicle as an example, which mainly includes the following steps when executed.

The first step, after the battery leaves the factory, a portion of batteries with the same specification to be tested is selected as reference batteries, and the electric power of the reference battery is discharged and the reference battery is charged with the constant current to a charged state, and a voltage-capacity profile during charging of the reference battery is recorded (i.e. The aforementioned second charging profile), by analyzing the charging voltage profile characteristics to acquire a first inflection voltage and a first inflection electric power Q_HVTP corresponding to a high voltage plateau inflection point (i.e., the first inflection point) of the battery, and a second inflection voltage and a second inflection electric power Q_LVTP corresponding to a low voltage plateau inflection point (i.e., the second inflection point) of the battery, and the first inflection electric power Q_HVTP is to be stored in the NVM of the BMS and the second inflection electric power Q_LVTP is written at a constant value in the corresponding software of the BMS, in order to facilitate quick calls for subsequent calculations.

The second step, a battery to be tested of unknown SOC state in a real vehicle application is charged, a voltage-capacity profile after the beginning of charging of the battery is recorded in real time (i.e., the aforementioned first charging profile), at least one target inflection point for the battery is determined according to the first charging profile and the first and second inflection voltages acquired in the first step, and during charging of the battery, the charged electric quantities of the battery when charged to each node are acquired in real time, including a first charged electric power Qch_HVTP when the battery is charged to the first inflection point, a second charged electric power Qch_End when the charging is completed, and a third charged electric power Qch_LVTP when the battery is charged to the second inflection point.

The third step, after charging is completed, according to the determined target inflection point and the charged electric power corresponding to the target inflection point, a correction update to the first inflection electric power Q_HVTP is made by: 1) if the first inflection point (HVTP) and the second inflection point (LVTP) are detected simultaneously, the first inflection electric power Q_HVTP is corrected according to the second inflection electric power Q_LVTP, the first charged electric power Qch_HVTP and the third charged electric power Qch_LVTP, and an update time thereof is stored in NVM for subsequent calculation; 2) If the second inflection point (LVTP) is not detected and the time from the last update time of the first inflection electric power Q_HVTP is greater than a preset time, the first inflection electric power Q_HVTP is corrected by empirical formula f(ΔT) and its update time is stored in NVM for subsequent calculations; more details of the above two correction methods can be found in the relevant content mentioned above and will not be repeated here.

The fourth step, after the battery is charged to a charged state, the current capacity Qnow of the battery is calculated, and after the current capacity Qnow of the battery is calculated, further the battery SOHC is calculated according to the current capacity Qnow of the battery. It should be noted that the detailed calculation method of the current capacity Qnow of the battery and the SOHC of the battery can be found in the relevant content mentioned above, and will not be repeated here.

The batteries generally used in electric vehicles need to be replaced when their capacity fades more than 20%, and thus batteries used in electric vehicles can be detected at least the high voltage plateau inflection point (the first inflection point) located in the higher SOC segment, thus the method for battery capacity determination in the embodiments of the present disclosure is particularly suitable for power batteries of electric vehicles.

In summary, the method for battery capacity determination according to the embodiments of the present disclosure does not require deep discharge of the battery prior to charging, avoids the loss of the battery itself from being fully charged or fully discharged, and is advantageous in improving the battery life and the charging safety. Furthermore, when the current capacity of the battery is calculated, it is only necessary to detect the first charged electric power when the battery is charged to the first inflection point (i.e., the high voltage plateau inflection point) and the second charged electric power when charging of the battery is completed, the capacity of the battery can be quickly calculated in conjunction with the first inflection electric power of the battery (i.e., the high voltage plateau inflection characteristic capacity), interval selection of SOC is not required. Compared to calculating the battery capacity by selecting a SOC interval for charging or discharging, errors caused by inaccurate SOC estimation on the battery state calculation can be avoided, and the accuracy of the battery capacity calculation is improved. Furthermore, when the determined target inflection points include the first inflection point and the second inflection point (i.e., a low voltage plateau inflection point), the first inflection electric power may also be corrected according to the second inflection electric power (i.e., the low voltage plateau inflection characteristic capacity), the first charged electric power and the third charged electric power when the battery is charged to the second inflection point, and when the determined target inflection point includes only the first inflection point and the time from the time of last correction of the first inflection electric power is greater than a preset time, the first inflection electric power is corrected according to the preset empirical formula of the first inflection electric power as a function of time. In this manner, the first inflection electric power is corrected in time, and inaccuracy of the current capacity calculation of the battery due to the variation of the first inflection electric power due to the battery aging can be avoided, which is advantageous for improving the accuracy of the battery capacity calculation. Two correction methods for the first inflection electric power allow the method for battery capacity determination in embodiments of the present disclosure to meet different usage habits for charging and discharging batteries by different users.

A non-transitory computer-readable storage medium according to an embodiment of the second aspect of the present disclosure, storing a computer program which, when executed by a processor, causes the processor to perform operations as mentioned in any of the above embodiments.

The non-transitory computer-readable storage medium according to an embodiment of the present disclosure can greatly improve the speed and accuracy of battery capacity calculation by executing a computer program stored thereon.

Figure 3:
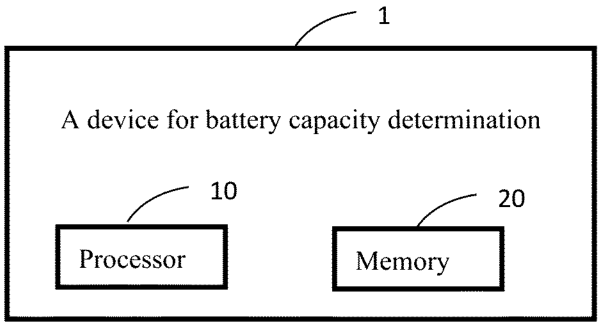
FIG. 3 is a functional block diagram of a device for battery capacity determination according to an embodiment of the present disclosure.

FIG. 3 shows a functional block diagram of a device for battery capacity determination 1 according to an embodiment of the third aspect of the present disclosure, as shown in FIG. 3, the device for battery capacity determination 1 provided by the present disclosure includes at least one processor 10 and a memory 20 communicatively connected to the at least one processor 10, the memory 20 stores instructions which executed by the at least one processor 10, the at least one processor 10 is configured to perform operations as mentioned in any of the embodiments above.

The device for battery capacity determination 1 according to an embodiment of the present disclosure, by the processor 10 executing the method for battery capacity determination mentioned in any of the embodiments above, can greatly improve the speed and accuracy of the battery capacity calculation.

Note that a battery whose capacity can be calculated by the method for battery capacity determination mentioned in any of the embodiments above is provided. A battery according to the embodiments of the present disclosure, the current capacity of which is calculated using the above-described method for battery capacity determination, can greatly improve the speed and accuracy of the battery capacity calculation.

In the description of the present disclosure, reference to "an embodiment," "a particular embodiment," "an example," or the like means that features, structures, materials or characteristics described in combination with the embodiment(s) or example(s) are included in at least one embodiment or example of the present disclosure. In this specification, descriptions of the foregoing terms do not necessarily refer to the same embodiment or example. In addition, the described features, structures, materials, or characteristics may be combined in a proper manner in any one or more of the embodiments or examples.

Although the embodiments of the present disclosure have been shown and described, it will be appreciated by a person skilled in the art that many changes, modifications, replacements, or variations can be made to the foregoing embodiments without departing from the principles and spirit of the present disclosure, the scope of which is defined by the following claims and their equivalents.

What is claimed is:

1. A method for determining a capacity of a battery, comprising:

acquiring a first inflection voltage, a corresponding first inflection electric power, a second inflection voltage, and a corresponding second inflection electric power of the battery, the first inflection voltage being greater than the second inflection voltage;

controlling, by a battery management system (BMS) via a processor, a charger to charge the battery, and collecting and recording, in real time during the charging of the battery, battery voltage and electric power to generate a first charging profile comprising a voltage-capacity profile;

generating, by the processor, a voltage differential profile of the first charging profile by performing smoothing filtering and a first-order derivation of voltage with respect to capacity data;

identifying, by the processor, a maximum point of the voltage differential profile and comparing a peak voltage corresponding to the maximum point to the first inflection voltage and the second inflection voltage, and determining at least one target inflection point of the battery according to the first charging profile;

detecting, by the processor, the electric power of the battery until the charging of the battery is completed, acquiring a first charged electric power of the battery when the battery is charged to a first inflection point of the battery, and acquiring a second charged electric power of the battery when the charging of the battery is completed; and when the at least one target inflection point comprises the first inflection point, calculating, by the processor, a current capacity of the battery Qnow of the battery according to the first inflection electric power Q_HVTP, the first charged electric power Qch_HVTP, and the second charged electric power Qch_End, where Qnow=Q_HVTP+Qch_End-Qch_HVTP.

2. The method according to claim 1, further comprising:

when the at least one target inflection point further comprises a second inflection point, acquiring a third charged electric power when the battery is charged to the second inflection point, and correcting the first inflection electric power according to the second inflection electric power Q_LVTP, the first charged electric power Qch_HVTP, and the third charged electric power Qch_LVTP; where $$Q\_HVTP = Q\_LVTP + Qch\_HVTP - Qch\_LVTP.$$

3. The method according to claim 1, further comprising:

when the at least one target inflection point comprises only the first inflection point, and a difference between a current time and a time of last correction of the first inflection electric power is greater than a preset time, correcting the first inflection electric power according to a formula of the first inflection electric power as a function of time.

4. The method according to claim 1, wherein the determining the at least one target inflection point by comparing the peak voltage to the first inflection voltage and the second inflection voltage comprises:

if the peak voltage is greater than the first inflection voltage, the maximum point is the at least one target inflection point, and the at least one target inflection point is the first inflection point; or if the peak voltage is less than the second inflection voltage, the maximum point is the at least one target inflection point, and the at least one target inflection point is the second inflection point.

5. The method according to claim 4, wherein the determining the at least one target inflection point by comparing the peak voltage to the first inflection voltage and the second inflection voltage further comprises:

if the peak voltage is neither greater than the first inflection voltage nor less than the second inflection voltage, continuing to charge the battery and searching for the at least one target inflection point.

6. The method according to claim 1, wherein the first charging profile comprises a voltage-capacity characteristic profile established according to first voltage data and corresponding first capacity data of the battery during the charging of the battery, and the acquiring the voltage differential profile of the first charging profile comprises:

performing smoothing filtering on the first charging profile and first order derivation on the first voltage data with respect to the first capacity data, acquiring a rate of change of the first voltage data with respect to the first capacity data, and establishing the voltage differential profile of the first charging profile according to the rate of change and the first capacity data.

7. The method according to claim 2, wherein the acquiring the first inflection voltage, the corresponding first inflection electric power, the second inflection voltage, and the corresponding second inflection electric power of the battery comprises:

acquiring a second charging profile;

determining the first inflection point and the second inflection point according to the second charging profile; and acquiring the first inflection voltage and the first inflection electric power corresponding to the first inflection point, and the second inflection voltage and second inflection electric power corresponding to the second inflection point.

8. The method according to claim 7, wherein the acquiring the second charging profile comprises:

determining one or more reference batteries;

discharging the one or more reference batteries and performing constant current charging of the one or more reference batteries;

recording second capacity data and corresponding second voltage data during the constant current charging; and establishing a voltage-capacity characteristic profile according to the second capacity data and the corresponding second voltage data to acquire the second charging profile.

9. The method according to claim 1, further comprising:

acquiring an initial capacity of the battery; and calculating State of Health Capacity (SOHC) of the battery according to the current capacity of the battery and the initial capacity of the battery.

10. The method according to claim 1, wherein the collecting and recording, in real time during the charging of the battery, battery voltage and electric power to generate a first charging profile comprises:

collecting and recording, by the BMS, at least one parameter of the battery: voltage, current, temperature, time of current charge, or charged electric power; and acquiring the first charging profile according to the at least one parameter by using a BMS charging algorithm.

11. The method according to claim 1, wherein the first inflection electric power is less than the second inflection electric power.

12. The method according to claim 1, wherein the first inflection voltage is a corresponding voltage of a high voltage plateau inflection point in a second charging profile, and the first inflection electric power is a corresponding inflection electric power of the high voltage plateau inflection point in the second charging profile.

13. The method according to claim 12, wherein the second inflection voltage is a corresponding voltage of a low voltage plateau inflection point in the second charging profile, and the second inflection electric power is a corresponding inflection electric power of the low voltage plateau inflection point in the second charging profile.

14. The method according to claim 1, further comprising:

acquiring capacities of the battery calculated in previous n times, and calculating a weighted current capacity of the battery according to the capacities of the battery calculated in previous n times.

15. The method according to claim 14, wherein State of Health Capacity (SOHC) of the battery is calculated according to the weighted current capacity of the battery and an initial capacity of the battery.

16. The method according to claim 2, wherein the acquiring the third charged electric power when the battery is charged to the second inflection point comprises:

acquiring, by the BMS, the third charged electric power when the battery is charged to the second inflection point.

17. The method according to claim 1, further comprising calculating the capacity of the battery.

18. A non-transitory computer-readable storage medium, storing a computer program which, when executed by a processor of a battery management system (BMS), causes the processor to perform operations comprising:

acquiring a first inflection voltage, a corresponding first inflection electric power, a second inflection voltage, and a corresponding second inflection electric power of a battery, the first inflection voltage being greater than the second inflection voltage;

controlling a charger to charge the battery, collecting and recording battery voltage and electric power to generate a first charging profile comprising a voltage-capacity profile of the battery in real time during the charging of the battery, and generating a voltage differential profile of the first charging profile by performing smoothing filtering and a first-order derivation of voltage with respect to capacity data;

identifying a maximum point of the voltage differential profile and comparing a peak voltage corresponding to the maximum point to the first inflection voltage and the second inflection voltage, and determining at least one target inflection point of the battery according to the first charging profile;

detecting an electric power of the battery until the charging of the battery is completed, acquiring a first charged electric power of the battery when the battery is charged to a first inflection point of the battery, and acquiring a second charged electric power of the battery when the charging of the battery is completed; and when the at least one target inflection point comprises the first inflection point, calculating a current capacity of the battery Qnow of the battery according to the first inflection electric power Q_HVTP, the first charged electric power Qch_HVTP, and the second charged electric power Qch_End, where Qnow=Q_HVTP+Qch_End-Qch_HVTP.

19. A device for determining a capacity of a battery, comprising:

at least one processor; and a memory connected with the at least one processor, the memory storing instructions, wherein the at least one processor is configured to execute the instructions to perform operations comprising:

acquiring a first inflection voltage, a corresponding first inflection electric power, a second inflection voltage, and a corresponding second inflection electric power of the battery, the first inflection voltage being greater than the second inflection voltage;

controlling a charger to charge the battery, collecting and recording battery voltage and electric power to generate a first charging profile comprising a voltage-capacity profile of the battery in real time during the charging of the battery, and generating a voltage differential profile of the first charging profile by performing smoothing filtering and a first-order derivation of voltage with respect to capacity data;

identifying a maximum point of the voltage differential profile and comparing a peak voltage corresponding to the maximum point to the first inflection voltage and the second inflection voltage, and determining at least one target inflection point of the battery according to the first charging profile;

detecting an electric power of the battery until the charging of the battery is completed, acquiring a first charged electric power of the battery when the battery is charged to a first inflection point of the battery, and acquiring a second charged electric power of the battery when the charging of the battery is completed; and when the at least one target inflection point comprises the first inflection point, calculating a current capacity of the battery Qnow of the battery according to the first inflection electric power Q_HVTP, the first charged electric power Qch_HVTP, and the second charged electric power Qch_End, where Qnow=Q_HVTP+Qch_End-Qch_HVTP.

* * * * *